United States Patent
Wan et al.

(10) Patent No.: US 7,652,918 B2
(45) Date of Patent: Jan. 26, 2010

(54) RETENTION MARGIN PROGRAM VERIFICATION

(75) Inventors: Jun Wan, Sunnyvale, CA (US); Jeffrey W. Lutze, San Jose, CA (US); Jian Chen, San Jose, CA (US); Yan Li, Milpitas, CA (US); Alex Mak, Los Altos Hills, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/617,546

(22) Filed: Dec. 28, 2006

(65) Prior Publication Data

US 2008/0158990 A1 Jul. 3, 2008

(51) Int. Cl.
*G11C 11/34* (2006.01)
*G11C 16/04* (2006.01)

(52) U.S. Cl. .................. 365/185.03; 365/185.22; 365/185.18

(58) Field of Classification Search ............ 365/185.03, 365/185.22, 185.18
See application file for complete search history.

(56) References Cited

U.S. PATENT DOCUMENTS

| 6,285,597 | B2 | 9/2001 | Kawahara et al. |
| 7,304,893 | B1 * | 12/2007 | Hemink ............... 365/185.22 |
| 2003/0217323 | A1 | 11/2003 | Guterman et al. |
| 2005/0024939 | A1 | 2/2005 | Chen et al. |
| 2005/0219896 | A1 | 10/2005 | Chen et al. |
| 2006/0221714 | A1 | 10/2006 | Li et al. |
| 2006/0227602 | A1 | 10/2006 | Honma et al. |
| 2007/0030732 | A1 | 2/2007 | Micheloni et al. |
| 2007/0147141 | A1 * | 6/2007 | Shibata ............... 365/189.09 |

OTHER PUBLICATIONS

U.S. Appl. No. 11/617,541, filed Dec. 28, 2006.
Amendment dated Jul. 28, 2008, U.S. Appl. No. 11/617,546, filed Dec. 28, 2006.
Office Action dated Aug. 28, 2008, U.S. Appl. No. 11/617,541, filed Dec. 28, 2006.
Office Action dated Apr. 21, 2009 in U.S. Appl. No. 11/617,541.
Response to Office Action filed Jun. 22, 2009 in U.S. Appl. No. 11/617,541.
International Preliminary Report on Patentability and Written Opinion of the International Searching Authority dated Jun. 30, 2009 in PCT Application No. PCT/US2007/088831.
Notice of Allowance and Fee(s) Due dated Aug. 11, 2009 in U.S. Appl. No. 11/617,541.
International Search Report and the Written Opinion of the International Searching Authority, mailed Jun. 11, 2008, PCT Appln. No. PCT/US2007/088831, filed Dec. 26, 2007.

* cited by examiner

*Primary Examiner*—Amir Zarabian
*Assistant Examiner*—Kretelia Graham
(74) *Attorney, Agent, or Firm*—Vierra Magen Marcus & DeNiro LLP

(57) ABSTRACT

A memory system, comprising an array of storage elements divided into logical blocks and pages within said logical blocks and a managing circuit is provided. The managing circuit is in communication with said array of storage elements and performs programming and reading operations. The programming operations include programming a plurality of multi-state storage data. The reading operations include defining an retention margin between adjacent data thresholds, determining whether bits are present in a portion of the data retention margin, and if the number of bits in the portion of retention margin exceeds a threshold, generating an error.

14 Claims, 9 Drawing Sheets

Fig. 9
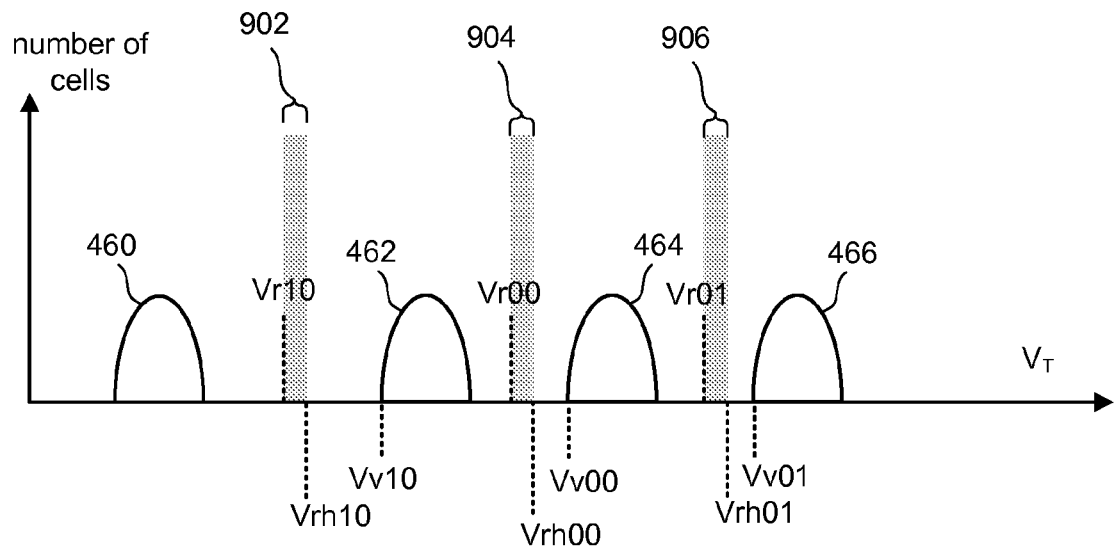
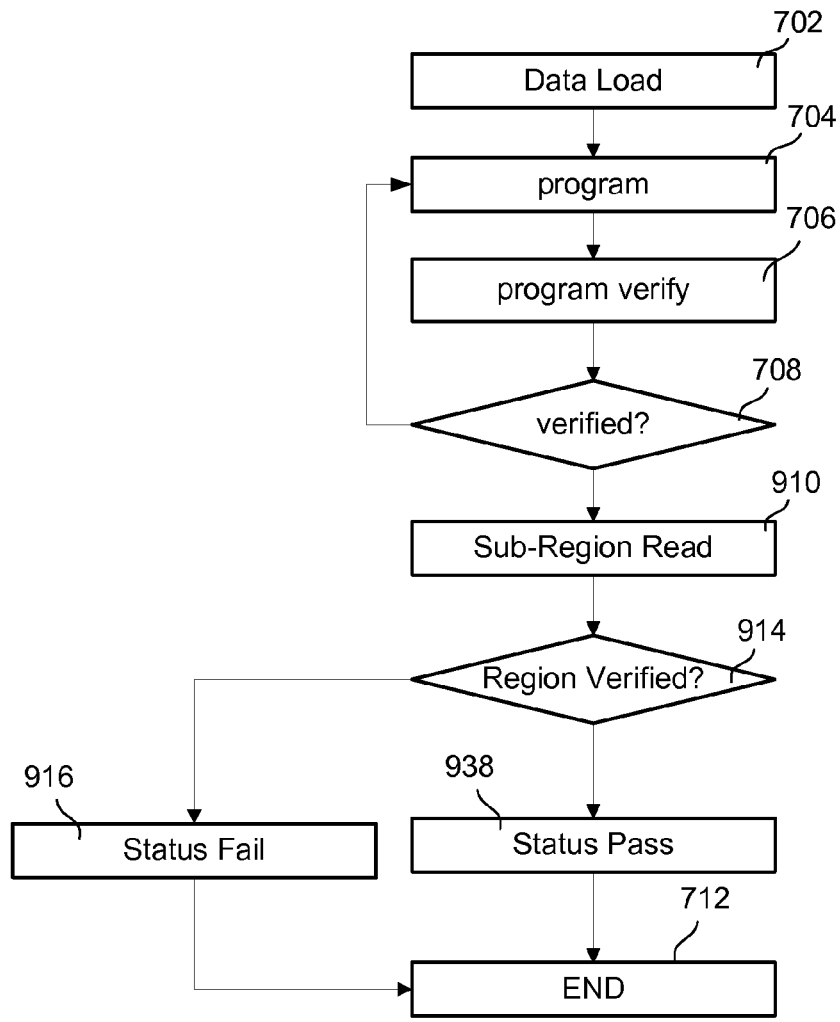
Fig. 10

RETENTION MARGIN PROGRAM VERIFICATION

CROSS-REFERENCE TO RELATED APPLICATION

U.S. patent application Ser. No. 11/617,541, entitled "Retention Margin Program Verification," by Jun Wan, et al., filed on Dec. 28, 2006.

TECHNICAL FIELD

The present technology relates generally to memory devices and, more specifically, to detecting whether memory devices have been programmed correctly.

BACKGROUND

Semiconductor memory devices are popular for use in various electronic devices. Non-volatile semiconductor memory is used in cellular telephones, digital cameras, personal digital assistants, mobile computing devices, non-mobile computing devices and other devices. Electrical Erasable Programmable Read Only Memory (EEPROM), including flash EEPROM, and Electronically Programmable Read Only Memory (EPROM) are among the most popular non-volatile semiconductor memories.

Reliability and certainty is an important issue to manufacturers of memory devices. A number of different techniques are used to increase reliability of information stored in such devices.

Typical EEPROMs and flash memories utilize a memory cell with a floating gate that is provided above and insulated from a channel region in a semiconductor substrate. The floating gate is positioned between source and drain regions. A control gate is provided over and insulated from the floating gate. The threshold voltage of the memory is controlled by the amount of charge that is retained on the floating gate. That is, the minimum amount of voltage that must be applied to the control gate before the memory cell is turned on to permit conduction between its source and drain is controlled by the level of charge on the floating gate.

Some EEPROM and flash memory devices have a floating gate that is used to store two ranges of charges and, therefore, the memory cell can be programmed/erased between two states. When programming an EEPROM or flash memory device, a program voltage is applied to the control gate and the bit line is grounded. Electrons from the p-well are injected into the floating gate. When electrons accumulate in the floating gate, the floating gate becomes negatively charged and the threshold voltage of the memory cell is raised.

Typically, the program voltage applied to the control gate is applied as a series of pulses. The magnitude of the pulses is increased with each pulse by a predetermined step size. In the periods between the pulses, verify operations are carried out. That is the programming level of each cell being programmed in parallel is read between each programming pulse to determine whether it is equal to or greater than a verify level to which it is being programmed. One means of verifying the programming is to test conduction at a specific compare point.

Conduction represents an "on" state of the device corresponding to the flow of current across the channel of the device. An "off" state corresponds to no current flowing across the channel between the source and drain. Typically, a flash memory cell will conduct if the voltage being applied to the control gate is greater than the threshold voltage and the memory cell will not conduct if the voltage applied to the control gate is less than the threshold voltage. By setting the threshold voltage of the cell to an appropriate value, the cell can be made to either conduct or not conduct current for a given set of applied voltages. Thus, by determining whether a cell conducts current at a given set of applied voltages, the state of the cell can be determined.

A multi-bit or multi-state flash memory cell is produced by identifying multiple, distinct threshold voltage ranges within a device. Each distinct threshold voltage range corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes. Proper data storage requires that the multiple ranges of threshold voltage levels of a multi-state memory cell be separated from each other by sufficient margin so that the level of the memory cell can be programmed or erased in an unambiguous manner.

In many cases it is necessary to program multiple memory cells in parallel, for example, in order to produce a commercially desirable memory system which can be programmed within a reasonable amount of time. However, a problem arises when a number of the memory cells are to be programmed at the same time. This is because the characteristics of each memory cell is different due to minor variations in the structure and operation of the semi-conductor devices which comprise the memory cells; therefore, variations in the programming speed of different cells will typically occur.

Typically, when data is being programmed, the verify process for the device will guarantee that the threshold voltage of the memory cell is higher than a minimum level. However, devices typically do not guarantee an upper limit on the threshold voltage. Over programming which raises the threshold voltage beyond the range for the desired state can occur without unless checked. Over programming can cause the memory cell to store incorrect data, thereby, causing an error during subsequent read operations. More information about over programming can be found in U.S. Pat. Nos. 5,321,699; 5,386,422; 5,469,444; 6,134,140 and 5,602,789.

To correct for over programming many memory systems use Error Correction Codes ("ECC") during subsequent read operations. When data is read from a device, the ECC is used to determine whether an error occurred. If the errors are small enough, the ECC can be used to correct the errors. However, the ECC process requires a large amount of processing time and, therefore, considerably slows down the operation of the memory system. Second, ECC requires dedicated hardware to perform the ECC in a reasonable amount of time and the trend is to reduce the size of the memory systems in order to be able to put more memory cells in the system and to make the system as small as possible to fit in smaller host devices.

Many current systems include a verify sequence which follows the actual programming of data in to the memory. These sequences only check whether the programmed bits exceed a threshold verify level. Although it is possible to compare programmed data with the original data, such a comparison is difficult. If over-program bits or other erroneous failures exist in the memory, a memory may still pass the verify test. Although ECC can generally correct these erroneous bits, there is still a potential for ECC failure.

Thus, there is a need for improved technology to detect over programming and other erroneous errors in memory cells.

SUMMARY

The invention, roughly described, includes a method and apparatus incorporating data verification using a data retention margin bit count to determine whether errors will result in the memory. Normally, this data retention margin is not used for data. In an ideally programmed memory, there are no bits in the margins after a program verify step. An extra read in one or more retention margins is performed after the normal program verify sequence and if the number of bits in a portion of these regions is more than a pre-set criteria, as defined by the memory manufacturer, the memory will fail verify status. In one embodiment, two reads are performed for each retention region—one at a threshold level and one at a compare read level. A determination is then made as to whether a bit falls into the retention margin; if so, a failure bit is detected. A latch is used to accumulate failure bits and a bit scan later used to determine whether failure bits exceeding a pre-determined threshold are stored in the latch. If so a failure error for the device is generated.

In one embodiment, the technology is a memory system, comprising an array of storage elements divided into logical blocks and pages within said logical blocks and a managing circuit. The managing circuit is in communication with said array of storage elements and performs programming and reading operations. The programming operations include programming a plurality of multi-state storage data. The reading operations include defining an retention margin between adjacent data thresholds, determining whether bits are present in a portion of the data retention margin, and if the number of bits in the portion of retention margin exceeds a threshold, generating an error.

In an alternative embodiment, a non-volatile memory system is provided. The non-volatile memory system includes an array of storage elements. In addition, the system includes a controller in communication with said array of storage elements. The controller performs programming operations including programming ones of said storage elements with data, determining whether bits are present in a portion of the data retention margin separating states of said data, and generating an error if the number of bits in the portion of the retention margin exceeds a threshold number of bits.

BRIEF DESCRIPTION OF THE DRAWINGS

FIG. 9 depicts memory cell threshold distributions in a multi-state memory cell and retention margins between cell distributions.

FIG. 10 is a flowchart depicting one embodiment of a verification method discussed herein.

DETAILED DESCRIPTION

Technology is disclosed for verifying the expected reliability of a memory device by evaluating data in a retention margin region. In particular, the technology herein includes a read after program verification on regions of a memory device not normally designated as storing data. If data is found in these regions, above a threshold number of bits, a verification failure status may be set. In various embodiments, the verification can be performed for one or more data retention margins regions of selectively configured size.

Figure 1:
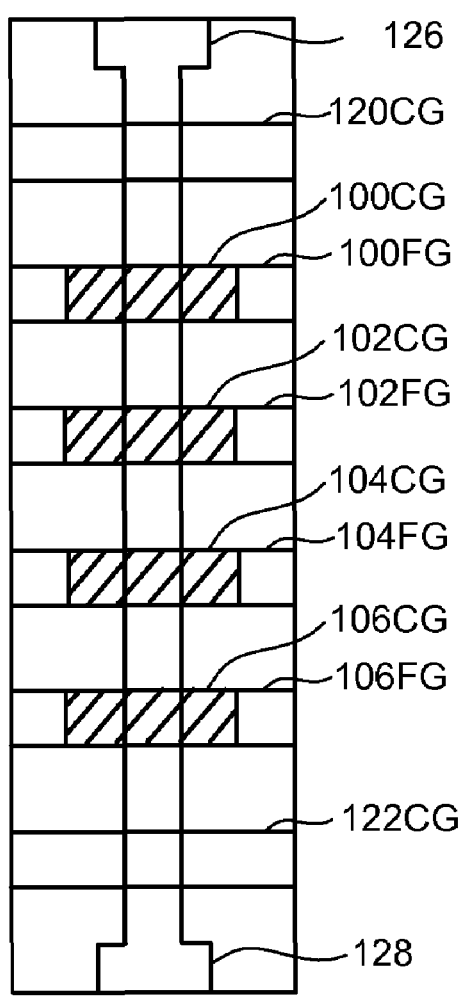
FIG. 1 is a top view of a NAND string.
Figure 2:
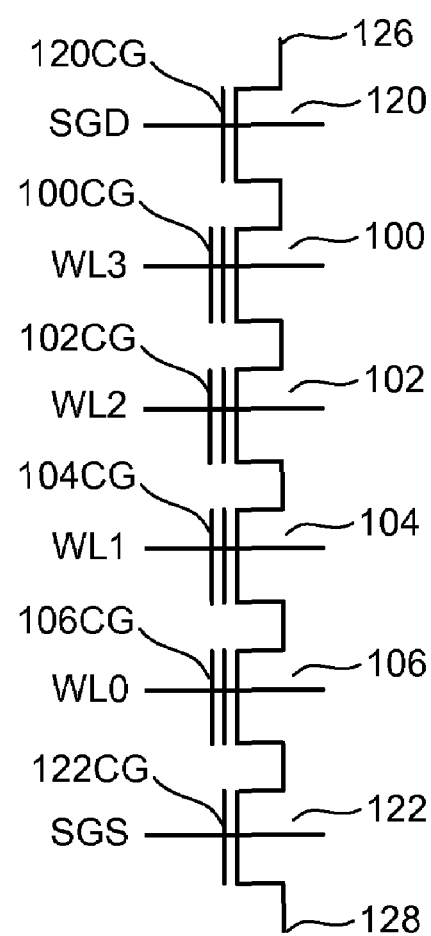
FIG. 2 is an equivalent circuit diagram of the NAND string.

One example of a flash memory system uses the NAND structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by the applying appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0.

Figure 3:
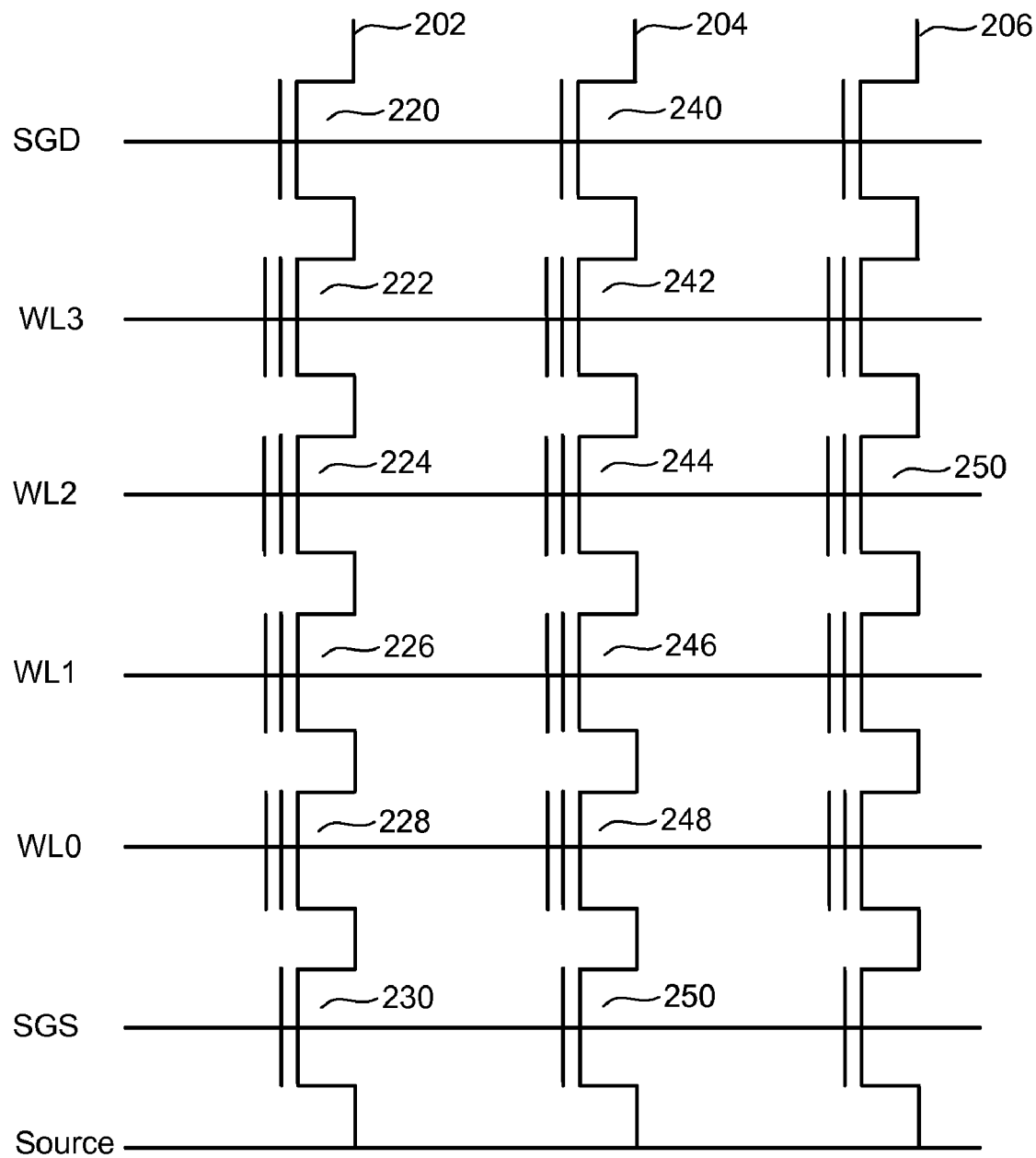
FIG. 3 is a circuit diagram depicting three NAND strings.

A typical architecture for a flash memory system using a NAND structure will include several NAND strings. For example, FIG. 3 shows three NAND strings 202, 204 and 206 of a memory array having many more NAND strings. Each of the NAND strings of FIG. 3 includes two select transistors and four memory cells. For example, NAND string 202 includes select transistors 222 and 230, and memory cells 222, 224, 226 and 228. NAND string 204 includes select transistors 240 and 250, and memory cells 242, 244, 246 and 248. Each string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224, memory cell 244, and memory cell 252. Word line WL1 is connected to the control gates for memory cell 226 and memory cell 246. Word line WL0 is connected to the control gates for memory cell 228 and memory cell 248. As can be seen, each bit line and the respective NAND string comprise the columns of the array of memory cells. The word lines (WL3, WL2, WL1 and WL0) comprise the rows of the array.

Each memory cell can store data (analog or digital). When storing one bit of digital data, the range of possible threshold voltages of the memory cell is divided into two ranges which are assigned logical data "1" and "0." In one example of a NAND type flash memory, the voltage threshold is negative after the memory cell is erased, and defined as logic "1." The threshold voltage after a program operation is positive and defined as logic "0." When the threshold voltage is negative and a read is attempted, the memory cell will turn on to indicate logic one is being stored. When the threshold voltage is positive and a read operation is attempted, the memory cell will not turn on, which indicates that logic zero is stored. A memory cell can also store multiple levels of information, for example, multiple bits of digital data. In the case of storing multiple levels of data, the range of possible threshold voltages is divided into the number of levels of data. For example, if four levels of information is stored, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00."

Relevant examples of NAND type flash memories and their operation are provided in the following U.S. Patents/Patent Applications, all of which are incorporated herein by reference in their entirety: U.S. Pat. No. 5,570,315; U.S. Pat. No. 5,774,397, U.S. Pat. No. 6,046,935, U.S. Pat. No. 6,456,528 and U.S. patent application Ser. No. 09/893,277 (Publication No. US2003/0002348). Other types of flash memory devices can also be used with the present technology. For example, the following patents describe NOR type flash memories and are incorporated herein by reference in their entirety: U.S. Pat. Nos. 5,095,344; 5,172,338; and 5,890,192. Another example of a flash memory type is found in U.S. Pat. No. 6,151,248, incorporated herein by reference in its entirety.

Figure 4:
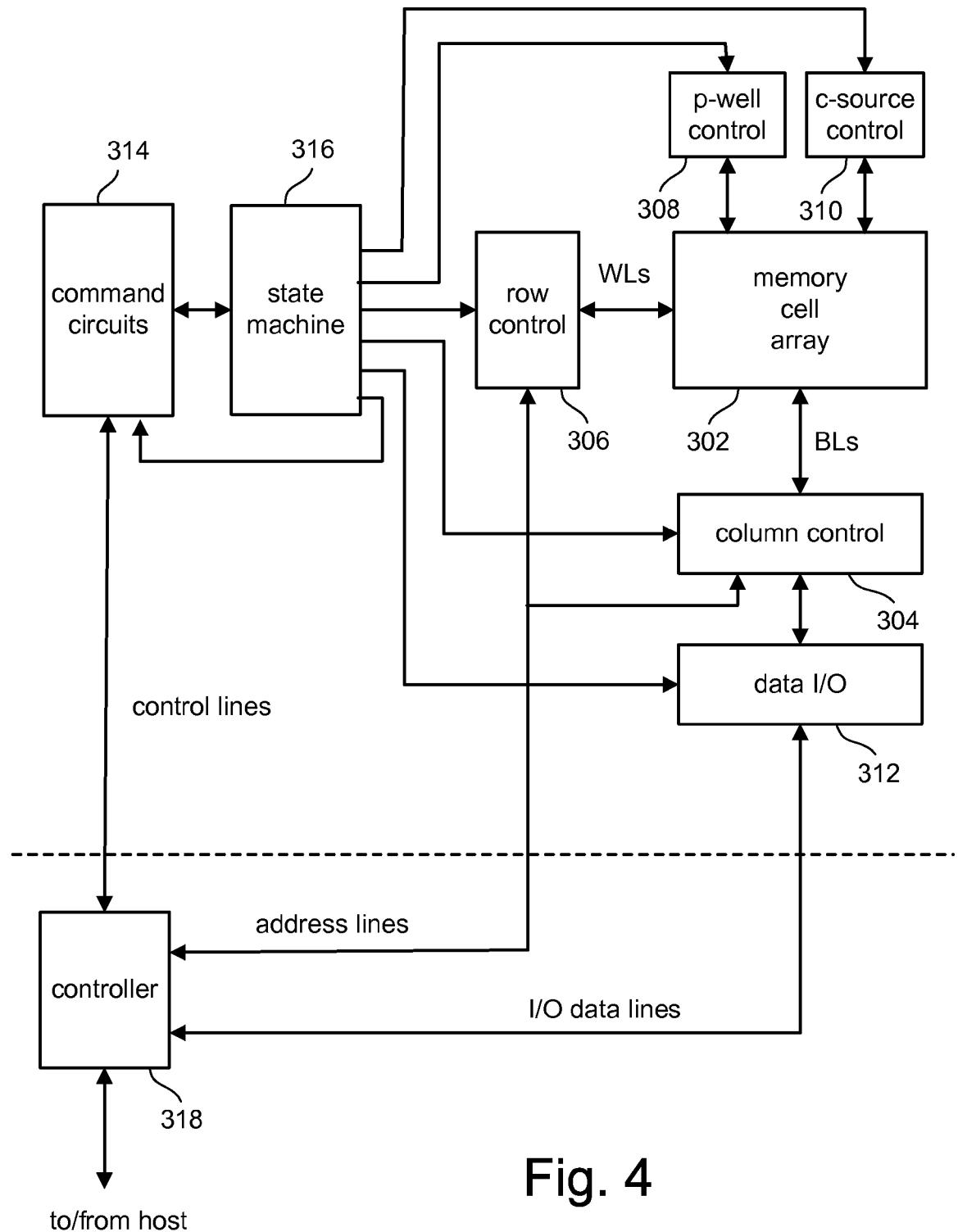
FIG. 4 is a block diagram of one embodiment of a non-volatile memory system in which the various aspects of the present technology are implemented.

FIG. 4 is a block diagram of one embodiment of a flash memory system that can be used to implement the present technology. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote the programming or to inhibit the programming. Row control circuit 306 is connected to the word lines to select one of the word lines, to apply read voltages, to apply program voltages and to apply an erase voltage. C-source control circuit 310 controls a common source line (labeled as "C-source" in FIG. 5) connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device is input to controller 318. The command data informs the flash memory of what operation is requested. The input command is transferred to state machine 316, which controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected or connectable with a host system such as a personal computer, a digital camera, personal digital assistant, etc. Controller 318 communicates with the host in order to receive commands from the host, receive data from the host, provide data to the host and provide status information to the host. Controller 318 converts commands from the host into command signals that can be interpreted and executed by command circuits 314, which is in communication with state machine 316. Controller 318 typically contains buffer memory for the user data being written to or read from the memory array.

One exemplary memory system comprises one integrated circuit that includes controller 318, and one or more integrated circuit chips that each contain a memory array and associated control, input/output and state machine circuits. The trend is to integrate the memory arrays and controller circuits of a system together on one or more integrated circuit chips. The memory system may be embedded as part of the host system, or may be included in a memory card (or other package) that is removably inserted into the host systems. Such a removable card may include the entire memory system (e.g. including the controller) or just the memory array(s) and associated peripheral circuits (with the Controller being embedded in the host). Thus, the controller can be embedded in the host or included within a removable memory system.

Figure 5:
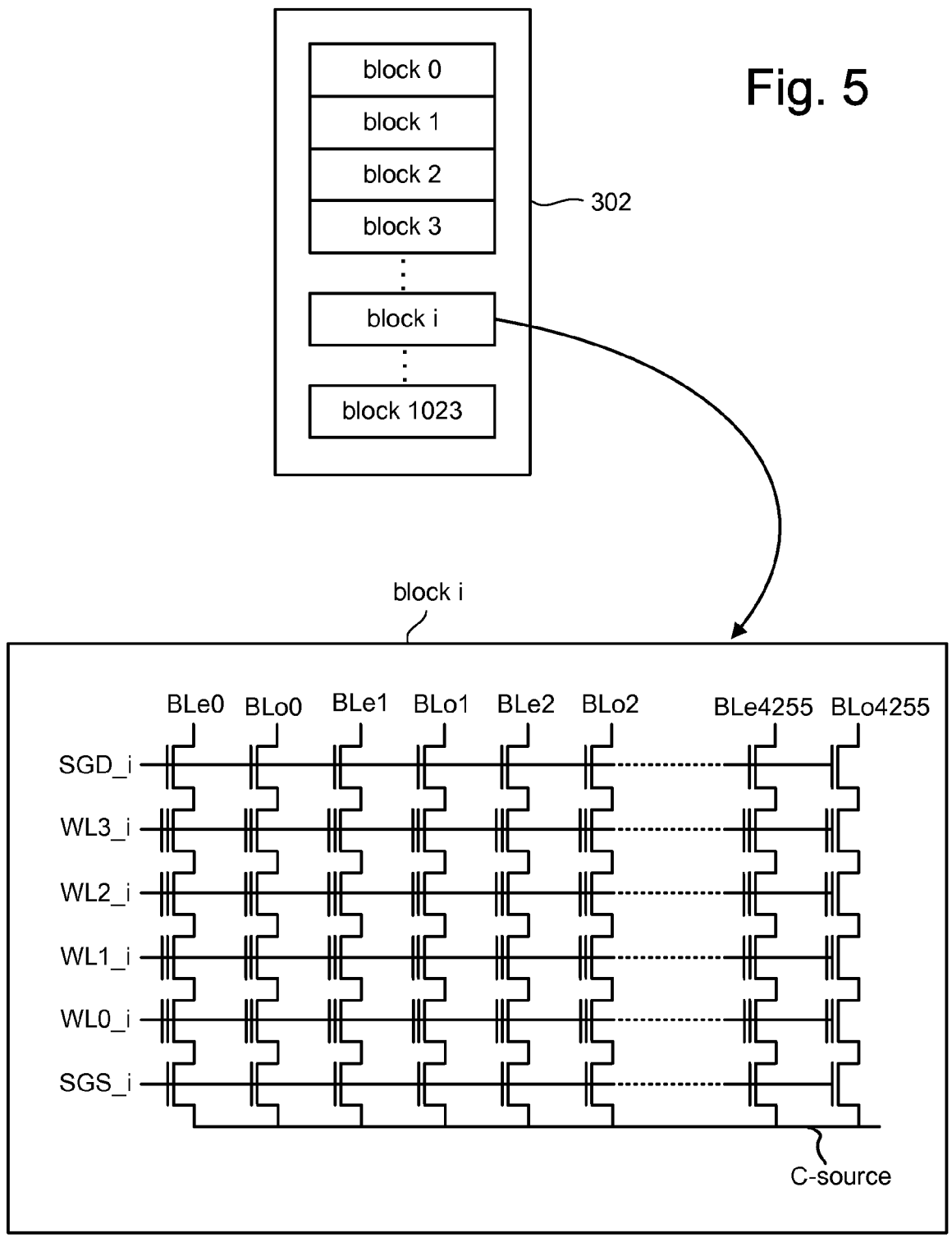
FIG. 5 illustrates an example of an organization of a memory array.

With reference to FIG. 5, an example structure of memory cell array 302 is described. As one example, a NAND flash EEPROM is described that is partitioned into 1,024 blocks. The data stored in each block is simultaneously erased. In one embodiment, the block is the minimum unit of cells that are simultaneously erased. Each block is typically divided into a number of pages which can be a unit of programming. Other units of data for programming are also possible and contemplated. In one embodiment, individual pages may be divided into segments and the segments may contain the fewest number of cells that are written at one time as a basic programming operation. One or more pages of data are typically stored in one row of memory cells.

In each block, in this example, there are 8,512 columns that are divided into even columns and odd columns. In an odd/even bit line architecture, memory cells along a common word line and connected to the odd bit lines are programmed at one time, while memory cells along a common word line and connected to even bit lines are programmed at another time. The bit lines are also divided into even bit lines (BLe) and odd bit lines (BLo). FIG. 5 shows four memory cells connected in series to form a NAND string. Although four cells are shown to be included in each NAND string, more or less than four can be used. One terminal of the NAND string is connected to corresponding bit line via a first select transistor SGD, and another terminal is connected to c-source via a second select transistor SGS.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time.

During read and programming operations, 4,256 memory cells are simultaneously selected. The memory cells selected have the same word line and the same kind of bit line (e.g. even bit lines). Therefore, 532 bytes of data can be read or programmed simultaneously. These 532 bytes of data that are simultaneously read or programmed form a logical page.

Therefore, one block can store at least eight logical pages (four word lines, each with odd and even pages). When each memory cell stores two bits of data (e.g. a multi-level cell), one block stores 16 pages. Other sized blocks and pages can also be used to implement embodiments.

Memory cells are erased by raising the p-well to an erase voltage (e.g. 20 volts) and grounding the word lines of a selected block. The source and bit lines are floating. Erasing can be performed on the entire memory array, separate blocks, or another unit of cells. Electrons are transferred from the floating gate to the p-well region and the threshold voltage becomes negative.

In the read and verify operations, the select gates (SGD and SGS) and the unselected word lines (e.g., WL0, WL1 and WL3) are raised to a read pass voltage (e.g. 4.5 volts) to make the transistors operate as pass gates. The selected word line (e.g. WL2) is connected to a voltage, a level of which is specified for each read and verify operation in order to determine whether a threshold voltage of the concerned memory cell has reached such level. For example, in a read operation for a two level memory cell, the selected word line WL2 may be grounded, so that it is detected whether the threshold voltage is higher than 0V. In a verify operation, the selected word line WL2 is connected to 2.4V, for example, so that it is verified whether the threshold voltage has reached at least 2.4V. The source and p-well are at zero volts. The selected bit lines (BLe) are pre-charged to a level of, for example, 0.7V. If the threshold voltage is higher than the read or verify level, the potential level of the concerned bit line (BLe) maintains the high level because of the non-conductive memory cell. On the other hand, if the threshold voltage is lower than the read or verify level, the potential level of the concerned bit line (BLe) decreases to a low level, for example less than 0.5V, because of the conductive memory cell. The state of the memory cell is detected by a sense amplifier that is connected to the bit line. The difference between whether the memory cell is erased or programmed depends on whether or not negative charge is stored in the floating gate. For example, if negative charge is stored in the floating gate, the threshold voltage becomes higher and the transistor can be in enhancement mode.

The erase, read and verify operations described above are performed according to techniques known in the art. Thus, many of the details explained can be varied by one skilled in the art.

When programming a memory cell in one example, the drain and the p-well receive 0 volts while the control gate receives a series of programming pulses with increasing magnitudes. In one embodiment, the magnitudes of the pulses in the series range from 12 volts to 24 volts. In other embodiments, the range of pulses in the series can be different, for example, having a starting level of higher than 12 volts. During programming of memory cells, verify operations are carried out in the periods between the programming pulses. That is, the programming level of each cell of a group of cells being programmed in parallel is read between each programming pulse to determine whether or not it has reached or exceeded a verify level to which it is being programmed. One means of verifying the programming is to test conduction at a specific compare point. The cells that are verified to be sufficiently programmed are locked out, for example in NAND cells, by raising the bit line voltage from 0 to $V_{DD}$ (e.g., 2.5 volts) for all subsequent programming pulses to terminate the programming process for those cells. In some cases, the number of pulses will be limited (e.g. 20 pulses) and if a given memory cell is not sufficiently programmed by the last pulse, an error is assumed. In some implementations, memory cells are erased (in blocks or other units) prior to programming.

Figure 6:
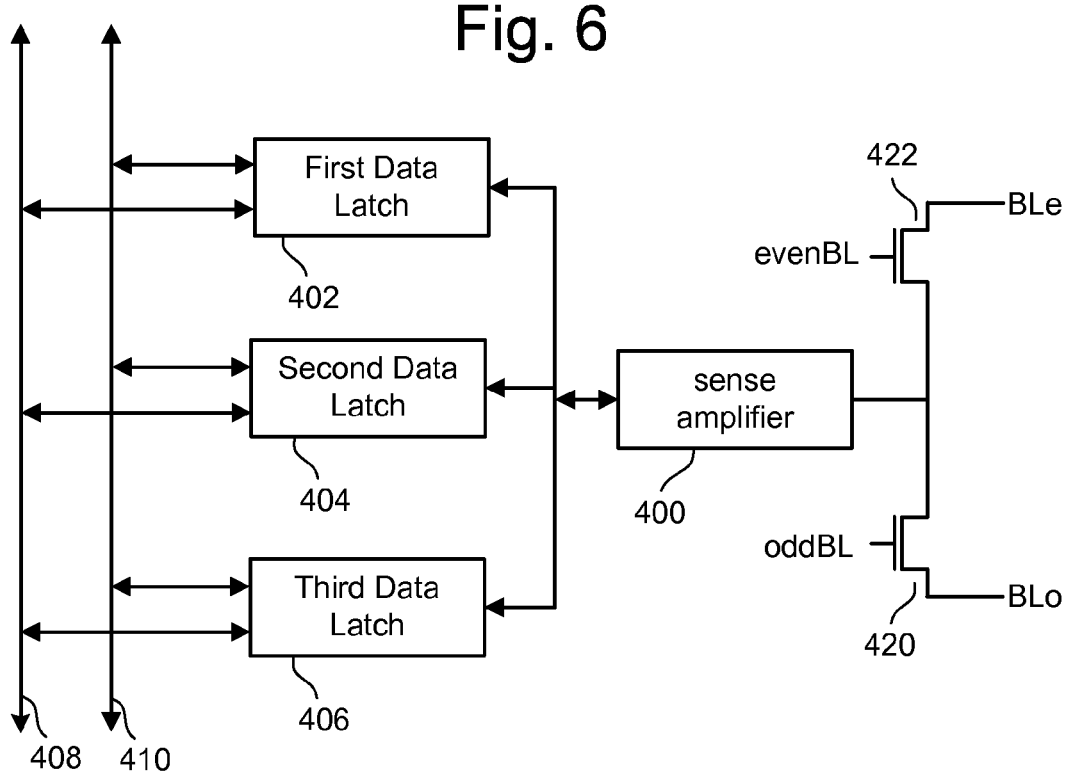
FIG. 6 depicts a portion of the column control circuit.

FIG. 6 depicts a portion of column control circuit 304 of FIG. 4. Each pair of bit lines (e.g. BLe and BLo) is coupled to a sense amplifier 400. The sense amplifier 400 is connected to three data latches: first data latch 402, second data latch 404 and third data latch 406. Each of the three data latches is capable of storing one bit of data. The sense amplifier 400 senses the potential level of the selected bit line during read or verify operations, stores the sensed data in a binary manner, and controls the bit line voltage during the program operation. The sense amplifier 400 is selectively connected to the selected bit line by selecting one of signals of "evenBL" and "oddBL." Data latches 402, 404 and 406 are coupled to I/O lines 408 to output read data and to store program data. I/O lines 408 are connected to data input/output buffer 312 of FIG. 4. Data latches 402, 404 and 406 are also coupled to status line(s) 410 to receive and send status information. In one embodiment, there is a sense amplifier, first data latch 402, second data latch 404 and third data latch 406 for each pair (even and odd) of bit lines.

Figure 7:
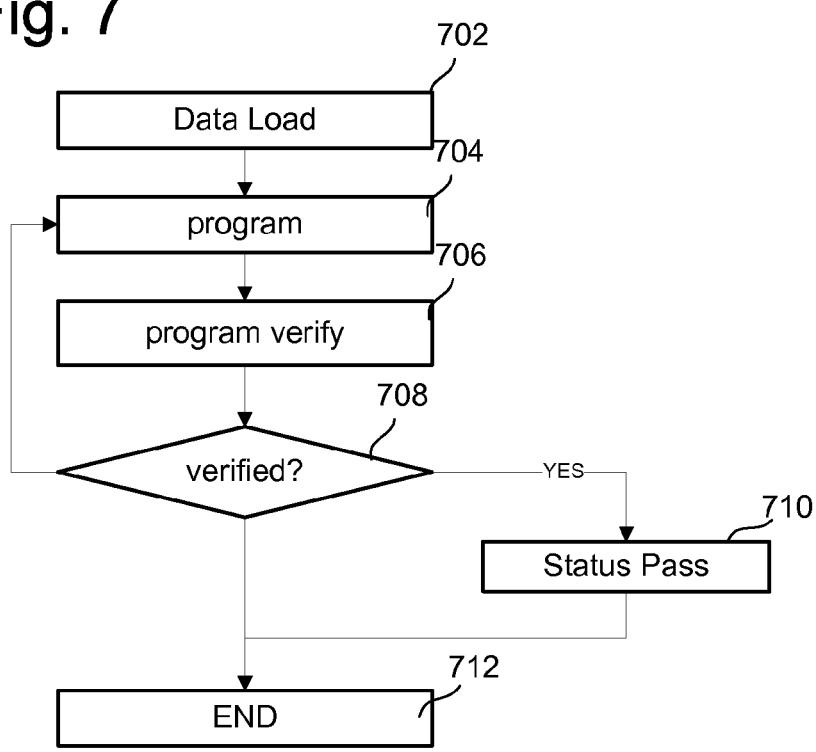
FIG. 7 is a flowchart depicting a typical method for programming a non-volatile memory device.

FIG. 7 is a simplified flow chart describing one embodiment of a method for programming non-volatile memory. Prior to the data load step 702, the memory cells to be programmed may be erased. At step 702 of FIG. 7, a "data load" command is issued by the controller. In one embodiment, this command is input to command circuits, allowing data to be input to a data input/output buffer. The input data is recognized as a command and latched by the state machine via a command latch signal, not illustrated, input to command circuits.

At step 704, data is programmed into the array. This may include a number of sub steps (not illustrated herein) including providing address data designating the page address input to the row controller or decoder from the controller or host, latching the input data, providing a page of program data for the addressed page to the input/output buffer for programming. For example, 532 bytes of data could be input in one embodiment. That data is latched in the appropriate registers for the selected bit lines. In some embodiments, the data is also latched in a second register for the selected bit lines to be used for verify operations. A "program" command is then issued by the controller and input to data input/output buffer.

Triggered by the "program" command, the data latched will be programmed into the selected memory cells controlled by state machine. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to VDD to inhibit programming.

At step 706, the states of the selected memory cells are verified in accordance with the description of read and verify operations set forth above. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed.

When all of the data latches are storing logic "1," the state machine knows that all selected cells have been programmed, it is checked whether all of the data latches are storing logic "1." If so, the programming process is complete and successful because all selected memory cells were programmed and verified to their target states. A status of "PASS" is reported at step 710.

If, at step 708, it is determined that not all of the data latches are storing logic "1," then the programming process continues. If the number of unsuccessfully programmed bits is equal to or less than the predetermined number, then the programming process is flagged as passed and a status of pass is reported at step 710. The bits that are not successfully programmed can be corrected using error correction during the read process. If however, the number of unsuccessfully programmed bits is greater than the predetermined number, the program process is flagged as failed and a status of fail is reported at step 712.

The flowchart of FIG. 7 depicts a single-pass programming method that can be applied for binary storage. A two-pass programming method as can be applied for multi-level storage, for example, multiple programming or verification steps may be used in a single iteration of the flowchart. Steps 704-712 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state.

Figure 8A:
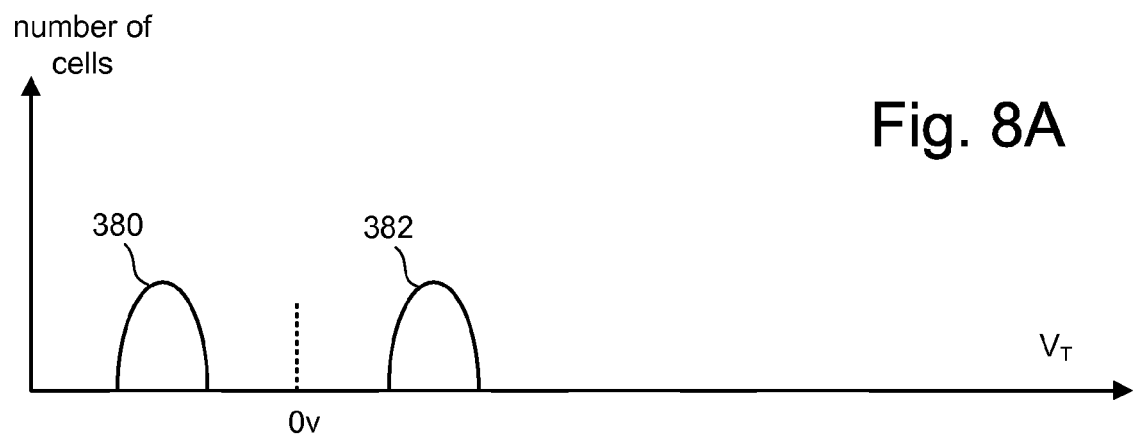
FIG. 8A depicts memory cell threshold distributions in a binary memory cell.

At the end of a successful program process, the threshold voltages of the memory cells should be within one or more distributions of threshold voltages for programmed memory cells or within a distribution of threshold voltages for erased memory cells. FIG. 8A illustrates threshold voltage distributions for a memory cell array when each memory cell stores one bit of data. FIG. 8A shows a first distribution 380 of threshold voltages for erased memory cells and a second distribution 382 of threshold voltages for programmed memory cells. In one embodiment, the threshold voltage levels in the first distribution 380 are negative and correspond to logic "1" while the threshold voltage levels in the second distribution 382 are positive and correspond to logic "0."

Figure 8B:
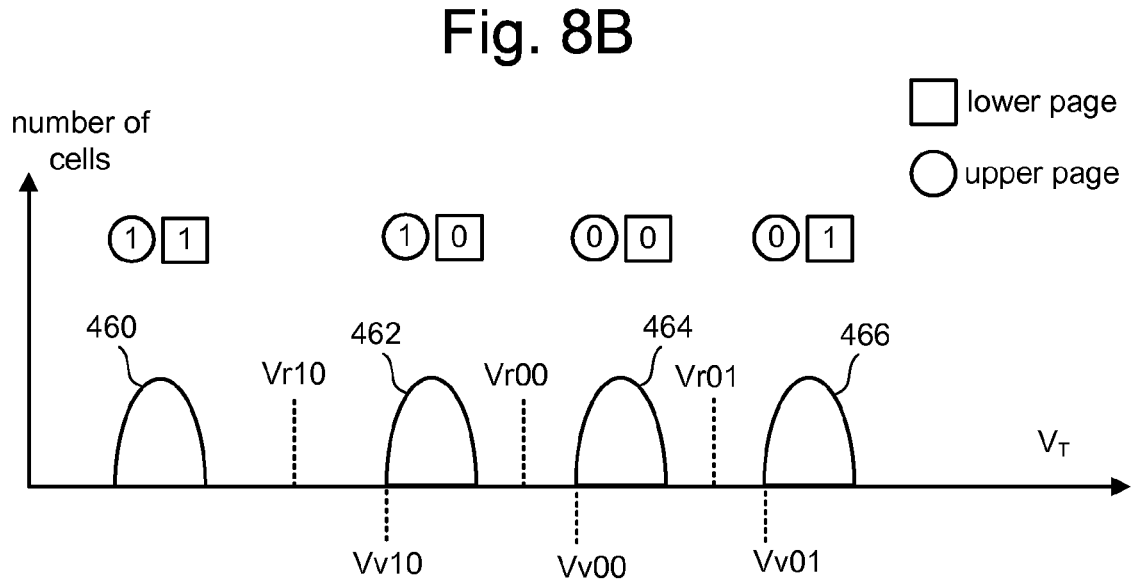
FIG. 8B depicts memory cell threshold distributions in a multi-state memory cell and illustrates one example of a technique for programming multi-state memory cells.

FIG. 8B illustrates exemplary threshold voltage distributions for a memory cell array when each memory cell stores two bits of data in four physical states. Distribution 460 represents a distribution of threshold voltages of cells that are in an erased state (storing "11"), having negative threshold voltage levels. Distribution 462 represents a distribution of threshold voltages of cells that are in a first programmed state, storing "10." Distribution 464 represents a distribution of threshold voltages of cells that are in a second programmed state, storing "00." Distribution 466 represents a distribution of threshold voltages of cells that are in a third programmed state, storing "01." Each of the two bits stored in a single memory cell, in this example, is from a different logical page. That is, each bit of the two bits stored in each memory cell carries a different logical page address. The bit displayed in the square corresponds to a lower page. The bit displayed in the circle corresponds to an upper page. In one embodiment, the logical states are assigned to the sequential physical states of memory cells using a gray code sequence so that if the threshold voltage of a floating gate erroneously shifts to its nearest neighboring threshold voltage state range, only one bit will be affected. In order to provide improved reliability, it is preferable for the individual distributions to be tightened (distribution narrowed), because the tighter distribution brings a wider read margin (distance between adjacent state threshold distributions).

If the memory is operated with more than four physical states then there will be a number of threshold voltage distributions within the defined voltage threshold window of the memory cells that is equal to the number of states. Further, although specific bit patterns have been assigned to each of the distributions or physical states, different bit patterns may be assigned.

In general the verification steps in a typical programming process only verify the bits to be programmed. One example of this technique is disclosed in U.S. Pat. No. 6,917,542. If bits are programmed to be higher than verify level, generally, a program verify step (706) indicates a status pass when in fact, one or more bits may be overprogrammed.

Some bits may actually be failures which result from over-programming, program disturb, and/or other erratic failures. Generally, an ECC correction process is used to recover these failed bits. However, there is still some possibility that recovery by ECC will fail. Memory could be more reliable if one could check how many fail bits after program at the system level or memory cell level.

One solution is to read the programmed data and compare it with the original data after program verify. For example, U.S. Pat. No. 6,917,542 discloses such a process. However, normally original data must be maintained for this programming step in order to complete the verification process.

FIG. 9 illustrates the retention margins principle utilized of the present technology. In general, data organized into threshold voltage distributions can be divided into three regions: the occupied distributions (460, 462, 464, 466); an over-program margin; and a data retention margin. In FIG. 9, the data retention margins are illustrated at 902, 904 and 906.

In accordance with the technology, as a verification step, the number of bits present in portions 902, 904 and 906 of the retention margins between the occupied distributions 460, 462, 464, and 466 are detected, and compared against a defined threshold. If the number of bits in one or more of the regions 902, 904, 906 exceeds a defined threshold, a status fail is indicated. In one embodiment, this verification process is performed by state machine 316.

In one embodiment, each retention margin is defined between the distributions: Vr10-Vv10, Vr00-Vv00, and Vr01-Vv01. In accordance the technology presented herein, after considering relaxation effect, sub-regions 902, 904, and 906 are characterized by a threshold read level (Vr) and a compare level (Vrh). In FIG. 9, sub-region 902 is defined between threshold read level Vr10 and compare voltage level Vrh10; sub-region 904 is defined between threshold read level Vr00 and compare voltage level Vrh00; and sub-region 906 is defined between threshold read level Vr01 and compare voltage level Vrh01. In an ideally programmed memory, there are no bits in the regions 902, 904, 906 after a program verify step. In one embodiment, the compare voltage levels Vrh10, Vrh00 and Vrh01 are parameters which are adjustable and lower than the normally used verify voltage levels, Vv10, Vv00 and Vv01, respectively. By applying Vrh to the control gate of a memory cell intended to be in given state (for example 11), it can be determined that the cell is over programmed if the cell does not conduct. Each of the retention margin compare points (Vrh) are slightly below the neighboring verify points (Vv). Each sub-region may be selectively configured.

The threshold parameters (Vr) are in one embodiment the same as a conventional verify level for the technology. The read high parameters are relative to the verify level. For any of regions 902, 904 and 906 the compare levels (Vrh) may be lower than the verify by 50 mV, 100 mV, 150 mV, etc in a range of about 0-350 mV. It will be recognized that various embodiments exist wherein one, two or three retention margins are read. Any one of the three regions 902, 904 and 906 may be checked.

FIG. 10 shows a program verify sequence in accordance with the present technology. In this process, an extra read at step 910 in one or more retention margins is performed after the normal programs verify sequence. At step 914, if the number of bits in these regions is more than a pre-set criteria, as defined by the memory manufacturer, the memory will fail verify status at step 916.

It will be recognized that there are various mechanisms employed in different memory technologies, and hence various means for determining whether error bits exist in the retention margin regions. One such method utilized with the technology described herein is illustrated in FIG. 11.

Figure 11:
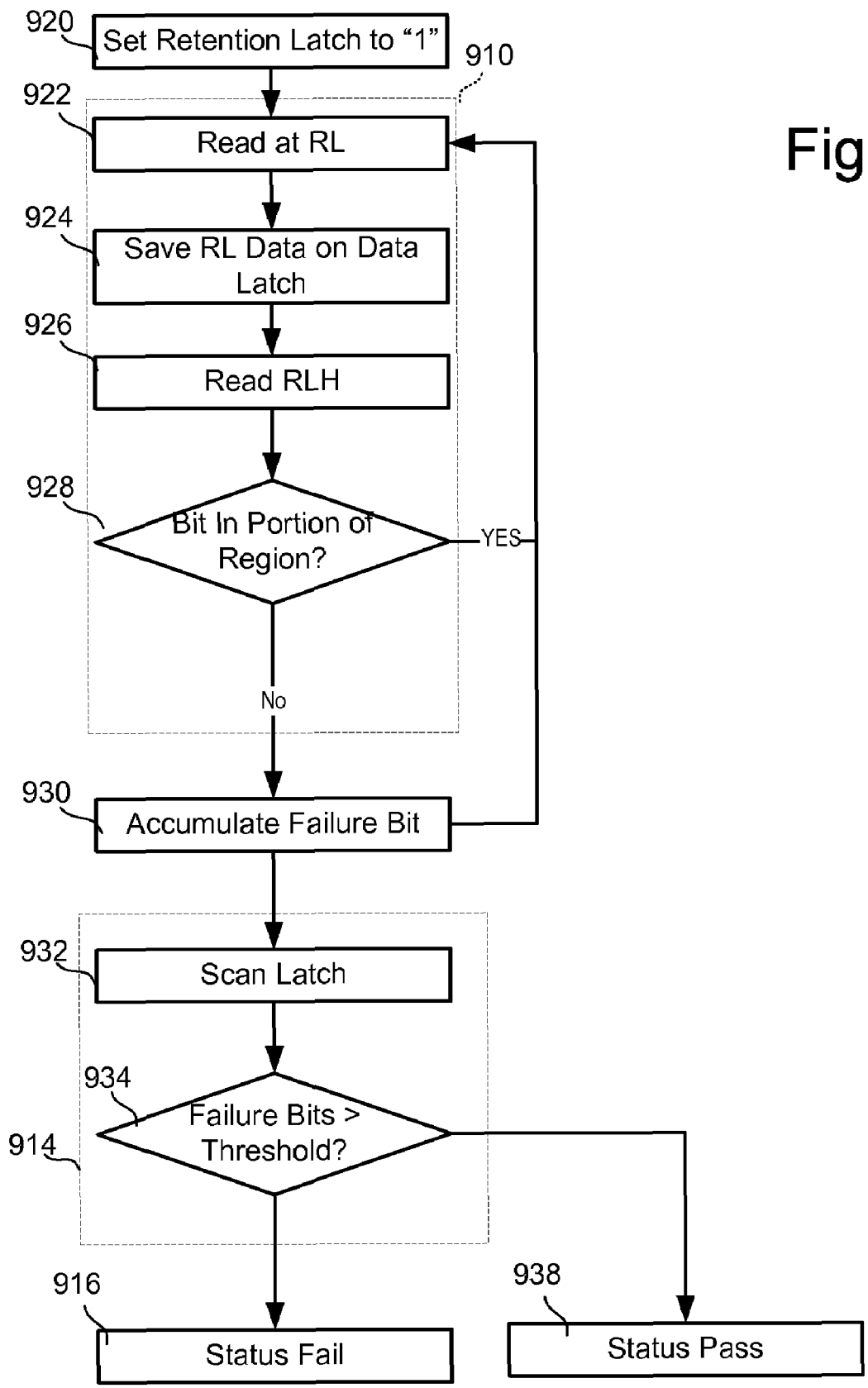
FIG. 11 depicts one embodiment of the retention margin verification discussed in FIG. 10.

FIG. 11 illustrates one method for performing the retention margin read 910 and retention margin verify 914 steps. Steps 922-932 illustrate a retention margin read and verify sequence in a NAND device utilizing a number of registers such as those in FIG. 6. In this sequence, two reads are performed for each region—one at the threshold level and one at the compare read level. A determination is then made as to whether a bit falls into the retention margin; if so, a failure bit is detected. A latch is used to accumulate failure bits and a bit scan later used to determine whether failure bits exceeding a pre-determined threshold are stored in the latch. If so a failure error for the device is generated.

At step 920, a retention latch (for example, the third latch 406) is set to a logic level "1". It will be understood that the original programmed bits will have been locked out prior to this retention margin verification step. Optionally, one of the latches shown in FIG. 6 may be used to cache the program data for the next program step. At step 922, a read at threshold read level (Vr) is performed for a given region 902, 904, 906, and the result saved on a data latch, for example, second latch 404, at step 924. As discussed above, a read is performed by raising the select gates and any unselected word lines to a read pass voltage and coupling the selected word to the voltage Vr. In this example, Vr will vary for a binary memory and for a multilevel memory, will depend on the region (902, 904, 906) and condition under investigation. The read at step 922 will verify whether the threshold voltage has reached at least Vr. The source and p-well are set at zero volts and the selected bit lines (BLe) are pre-charged to a level of, for example, 0.7V. If the threshold voltage is higher than the verify level Vr, the potential level of the concerned bit line (BLe) maintains the high level because of the non-conductive memory cell. The state of the memory cell is detected by a sense amplifier that is connected to the bit line.

At step 924, the state of the memory cell is stored on a data latch, for example the second latch. As discussed below, this state is compared to data read at Vrh and with the "1" stored in the retention latch to determine whether a failure bit exists.

At step 926, a read is performed at the compare level (Vrh) for the given region 902, 904, 906. At a step 928, a determination is made as to whether a bit exists in the region. In one embodiment, this operation may be performed by comparing the value read by the sense amp at step 926 with the value in the retention latch in a logical OR operation, and then performing a logical AND operation with the result and the "1" stored in the third latch. Under this operation, a failure bit will be accumulated at step 930 when a "1" stored in the retention latch is flipped to a "0". Because of the logical AND operation, no "0" bits (in the retention latch) are flipped to a "1". Failure bits are accumulated for the retention margin under consideration. Steps 922-930 can be repeated for one, two or three retention margins.

For each condition tested, a bit scan 932 can then be performed to detect how many failure bits are present in the retention latch. If the number of bits in the latch is more than the predetermined criteria, at step 934, the program will show a failed status 936.

In one embodiment a special status bit can indicate that the failure is due to the retention margin read mode.

There are numerous variations on the present technology. For example, the process shown in FIG. 11 illustrates a single retention margin read such as in a binary state memory. In one alternative, only one region, for example, region 904, of a multi state memory may be checked. In this latter example, this would require two extra reads per page. Alternatively, one could check two or three retention margins. Where three regions are checked, this would require six extra reads. Obviously, each read may have the effect of slowing overall programming speed. However, this can be compensated for by using more aggressive programming parameters, such as, for example, a slightly higher state Vpgm.

Figure 12:
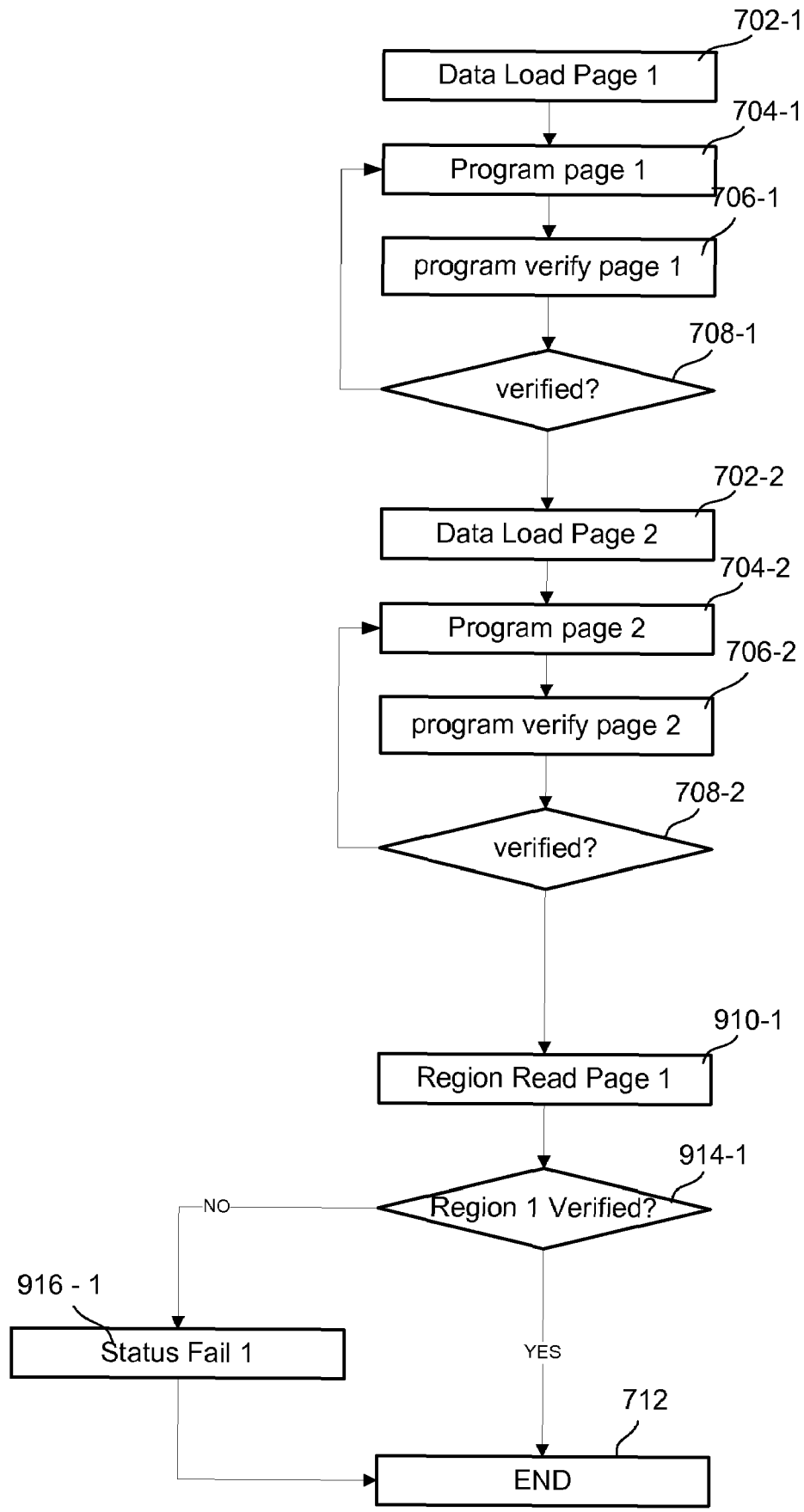
FIG. 12 is a flowchart depicting another embodiment of a verification method discussed herein.

In another variation, while the above description illustrates a page-read, but the verification step may be used on any region of interest, such as a logical page, a word-line or group of word lines, or a block or group of blocks. In addition, the retention margin read is not limited to reading on the same page as programming occurred. The retention margin verify step may be performed on any former page, former word line or former block. For example, as shown in FIG. 12, a program sequence may be performed on a first page and verified, then on a second page and verified on the second page. The retention margin region verification can then be used on the first page.

In another implementation, the retention region read may be used in the field to catch latent defects in the memory device after the device reaches the consumer. The retention margin verification is not limited to NAND flash memory, but may be utilized with any flash memory that reads and writes by page.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

We claim:

1. A memory system, comprising:
   an array of storage elements divided into logical blocks and pages within said logical blocks; and
   a managing circuit in communication with said array of storage elements, said managing circuit performs programming and reading operations including programming a plurality of multi-state storage cells with multi-state data in data regions defined between a voltage threshold and an upper voltage limit, defining a retention margin between the upper voltage limit of each data region and the voltage threshold of an adjacent data region, determining whether a number of bits are present in a defined portion of each data retention margin between a retention voltage threshold higher than said upper voltage limit, and a voltage checkpoint lower than said voltage threshold of the adjacent data region; and if the number of bits in the defined portion of retention margin exceeds a threshold, generating an error.

2. The memory system of claim 1 wherein the managing circuit programs the retention voltage as a read verify voltage.

3. The memory system of claim 1 wherein the managing circuit programs at least four data regions.

4. The memory system of claim 1 wherein managing circuit performs determining whether bits are present by reading operations including reading data in a region of interest at a read verify voltage and reading data in a region of interest at a voltage checkpoint lower than said read verify voltage, and performing a logical OR operation for each bit in said read operation.

5. The memory system of claim 4 wherein the region of interest is a logical page of data.

6. The memory system of claim 4 wherein the region of interest is a word line.

7. The memory system of claim 4 wherein the region of interest is a bit line.

8. The memory system of claim 1 wherein the programming operation includes verifying operations on the data by reading the multi-state storage data at a program verify voltage.

9. A non-volatile memory system, comprising:
an array of multi-state storage elements; and
a controller in communication with said array of storage elements, said controller performing programming operations including programming ones of said storage elements with multi-state data in data regions defined between a voltage threshold and an upper voltage limit, determining whether bits are present in a portion of a data retention margin separating said data regions, the portion of each data retention margin being between a retention voltage threshold, higher than the upper voltage limit of each data region and a voltage checkpoint lower than the voltage threshold of an adjacent data region, and generating an error if the number of bits in the portion of the data retention margin exceeds a threshold number of bits.

10. The memory system of claim 9 wherein the system includes a state machine including at least a data latch and a retention latch, and wherein determining whether bits are present in the data retention margin portion includes a first read at a first verify level storing data in a data register, and a second read at a compare level comparing said second read with data in the data register and storing error bits in a retention register.

11. The memory system of claim 9 wherein the array of storage elements stores multi-state data in at least two logical pages, and each page defined by two threshold voltage distributions, and the portion of the retention margin defined between two of said threshold voltage distributions.

12. The memory system of claim 9 including three retention margin portions, each of said three retention margin portions defined between a respective two voltage distributions, said controller determining whether bits are present in each data retention margin.

13. The memory system of claim 9 wherein controller performs determining whether bits are present by reading operations including reading data in a region of interest at a read verify voltage and reading data in a region of interest at a voltage checkpoint lower than said read verify voltage, and performing a logical OR operation for each bit in said read operation.

14. A non-volatile memory system, comprising:
an array of storage elements; and
a controller in communication with said array of storage elements, said controller performing programming operations including programming ones of said storage elements with data, determining whether bits are present in a portion of a data retention margin separating states of said data, and generating an error if the number of bits in the portion of the retention margin exceeds a threshold number of bits;
wherein the system includes a state machine including at least a data latch and a retention latch, and wherein determining whether bits are present in the data retention margin portion includes a first read at a first verify level storing data in a data register, and a second read at a compare level comparing said second read with data in the data register and storing error bits in a retention register.

* * * * *